(12) United States Patent
Kawaguchi (10) Patent No.: US 11,916,337 B2
(45) Date of Patent: Feb. 27, 2024

(54) WIRE HARNESS

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventor: Daichi Kawaguchi, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 123 days.

(21) Appl. No.: 17/786,872

(22) PCT Filed: Dec. 17, 2020

(86) PCT No.: PCT/JP2020/047071
§ 371 (c)(1),
(2) Date: Jun. 17, 2022

(87) PCT Pub. No.: WO2021/140859
PCT Pub. Date: Jul. 15, 2021

(65) Prior Publication Data
US 2023/0033383 A1 Feb. 2, 2023

(30) Foreign Application Priority Data

Jan. 6, 2020 (JP) ................................ 2020-000220

(51) Int. Cl.
*H05K 9/00* (2006.01)
*H01B 7/00* (2006.01)
(Continued)

(52) U.S. Cl.
CPC ..... *H01R 13/65918* (2020.08); *H01B 7/0045* (2013.01); *H01R 13/50* (2013.01);
(Continued)

(58) Field of Classification Search
CPC .................................................... H05K 9/0098
See application file for complete search history.

(56) References Cited

U.S. PATENT DOCUMENTS 4,382,653 A * 5/1983 Blanchard .......... H01R 13/6592
439/607.41
5,352,126 A 10/1994 Kuboshima et al.
(Continued)

FOREIGN PATENT DOCUMENTS

JP H06-333642 A 12/1994
JP H10-125404 A 5/1998
(Continued)

OTHER PUBLICATIONS

Mar. 2, 2021 International Search Report issued in International Patent Application No. PCT/JP2020/047071.

*Primary Examiner* — Hung V Ngo
(74) *Attorney, Agent, or Firm* — Oliff PLC (57) ABSTRACT

A wire harness including a wire and a connector, wherein the connector includes a connector main body that is partially or entirely made of a conductive resin or is partially formed by a conductive portion, a shield that is made of a conductive metal and covers a periphery of the connector main body, and a conductive elastic member that is provided between the connector main body and the shield, a circumference of the wire is covered by a tube, the tube including a heat-shrinkable shielding tube having a conductive portion that is configured to surround the circumference of the wire, and in a state in which the tube is attached to an attachment of the connector main body, the conductive portion of the tube, the (Continued)

connector main body, the conductive elastic member, and the shield are electrically connected to each other.

5 Claims, 3 Drawing Sheets

(51) Int. Cl.
*H01R 13/50* (2006.01)
*H01R 13/502* (2006.01)
*H01R 13/6581* (2011.01)
*H01R 13/6591* (2011.01)
*H01R 13/6598* (2011.01)

(52) U.S. Cl.
CPC ....... *H01R 13/502* (2013.01); *H01R 13/6581* (2013.01); *H05K 9/0098* (2013.01); *H01R 13/6598* (2013.01)

(56) References Cited

U.S. PATENT DOCUMENTS

| | | | | |
|---|---|---|---|---|
| 2004/0106325 A1* | 6/2004 | Miyazaki | ............. | H01R 13/648 439/564 |
| 2012/0058674 A1* | 3/2012 | Deno | ................. | H01R 13/6593 439/607.52 |
| 2014/0202763 A1* | 7/2014 | Adachi | .................... | H02H 3/02 174/72 A |
| 2018/0154847 A1* | 6/2018 | Oka | ...................... | H01B 7/0063 |
| 2019/0089099 A1* | 3/2019 | Yoshiura | ............ | H01R 13/6581 |

FOREIGN PATENT DOCUMENTS

| | | |
|---|---|---|
| JP | 2004-327100 A | 11/2004 |
| JP | 2007-103044 A | 4/2007 |

\* cited by examiner

WIRE HARNESS

BACKGROUND

The present disclosure relates to a wire harness.

Conventionally, in a wire harness for electrically connecting electric devices installed in an automobile or the like, a shielded wire with an electromagnetic shielding structure has been used as a wire that may emit a relatively large amount of electromagnetic waves when current flows.

A well-known example of the electromagnetic shielding structure is a braided shield that is formed by braiding thin metal bare wires into a mesh and that covers the circumference of the wire (see JP H6-333642A, for example).

SUMMARY

As for a wire harnesses used for a section where electromagnetic waves may be emitted, not only the wire but also a connector portion need to be provided with an electromagnetic shielding structure. In this case, the periphery of the connector portion is covered by a shielding member made of a conductive metal, and this shielding member and a braided shield portion are directly or indirectly electrically connected to each other, and then a ground connection is made at any position.

However, since the braided shield portion is formed by braiding thin metal bare wires, when electrically connecting the braided shield portion to the shielding member, the braided metal bare wires may come loose more than necessary, the metal bare wires may break during stripping of an insulating coating from the braided shield portion, and other problems may occur. Therefore, the operation for electrically connecting the braided shield portion is troublesome.

An exemplary aspect of the disclosure provides a wire harness for which an electromagnetic shielding structure can be easily adopted.

A wire harness of the present disclosure is a wire harness including a wire; and a connector provided at an end of the wire, and having an electromagnetic shield for suppressing emission of an electromagnetic wave from the wire, wherein: the connector includes a connector main body that is partially or entirely made of a conductive resin or is partially formed by a conductive portion, a shield that is made of a conductive metal and covers a periphery of the connector main body, and a conductive elastic member that is provided between the connector main body and the shield, a circumference of the wire is covered by a tube, the tube including a heat-shrinkable shielding tube having a conductive portion that is configured to surround the circumference of the wire, and in a state in which the tube is attached to an attachment of the connector main body, the conductive portion of the tube, the connector main body, the conductive elastic member, and the shield are electrically connected to each other.

According to the present disclosure, it is possible to provide a wire harness for which an electromagnetic shielding structure can be easily adopted.

DETAILED DESCRIPTION OF EMBODIMENTS

Description of Embodiments of Present Disclosure

First, embodiments of the present disclosure will be listed and described.

A wire harness of the present disclosure relates to:

[1] a wire harness including a wire and a connector portion provided at an end portion of the wire, and having an electromagnetic shielding structure for suppressing emission of an electromagnetic wave from the wire including the connector portion, wherein the connector portion includes a connector main body portion that is partially or entirely made of a conductive resin or is partially constituted by a conductive portion, a shielding member that is made of a conductive metal and covers a periphery of the connector main body portion, and a conductive elastic member that is provided between the connector main body portion and the shielding member, a circumference of the wire is covered by a tube member, the tube member including a heat-shrinkable shielding tube having a conductive portion that is configured to surround the circumference of the wire, and, in a state in which the tube member is attached to an attachment portion of the connector main body portion, the conductive portion of the tube member, the connector main body portion, the conductive elastic member, and the shielding member are electrically connected to each other.

According to the above-described aspect, the tube member that covers the circumference of the wire includes a heat-shrinkable shielding tube that is configured to surround the circumference of the wire, and when the tube member is attached to the attachment portion of the connector main body portion, the conductive portion of the tube member, the connector main body portion, the conductive elastic member, and the shielding member are electrically connected to each other. The use of the heat-shrinkable shielding tube, which is easier to electrically connect than a braided shield, makes it possible to easily adopt an electromagnetic shielding structure for the wire harness including the connector portion.

[2] It is preferable that the tube member is attached to an outer surface of the attachment portion of the connector main body portion, and the attachment portion has a first locking portion on the outer surface of the attachment portion, the first locking portion being capable of locking the tube member at least in a direction in which the tube member comes loose.

According to the above-described aspect, the first locking portion that is provided on the outer surface of the attachment portion of the connector main body portion locks the tube member at least in the direction in which the tube member comes loose, and therefore, the tube member is unlikely to come loose from the attachment portion.

[3] It is preferable that the first locking portion is provided in an annular shape on the attachment portion.

According to the above-described aspect, since the first locking portion is provided in an annular shape on the outer surface of the attachment portion of the connector main body portion, the tube member is more reliably locked in the direction in which it comes loose, and the tube member is even more unlikely to come loose. Also, since a labyrinthine structure is formed between the tube member and the attachment portion, an improvement in sealing performance and other effects can be expected.

[4] It is preferable that the conductive elastic member is provided in an annular shape on an outer surface of the connector main body portion.

According to the above-described aspect, since the conductive elastic member that is provided between the connector main body portion and the shielding member is provided in an annular shape on the outer surface of the connector main body portion, an improvement in the sealing performance between the connector main body portion and the shielding member, and other effects can be expected.

[5] It is preferable that the connector main body portion and the shielding member have second locking portions that can be locked to and unlocked from each other so as to enable attachment and detachment of the connector main body portion and the shielding member relative to each other.

According to the above-described aspect, since the connector main body portion and the shielding member have the second locking portions that can be locked to and unlocked from each other, attachment and detachment of the connector main body portion and the shielding member relative to each other can be performed. Thus, for example, the connector main body portion and the shielding member can be separately replaced.

Details of Embodiments of Present Disclosure

Specific examples of a wire harness of the present disclosure will be described below with reference to the drawings. Note that the present disclosure is not limited to these illustrative examples, but is rather indicated by the claims, and all modifications that come within the meaning and range of equivalency of the claims are intended to be embraced therein.

Figure 1:
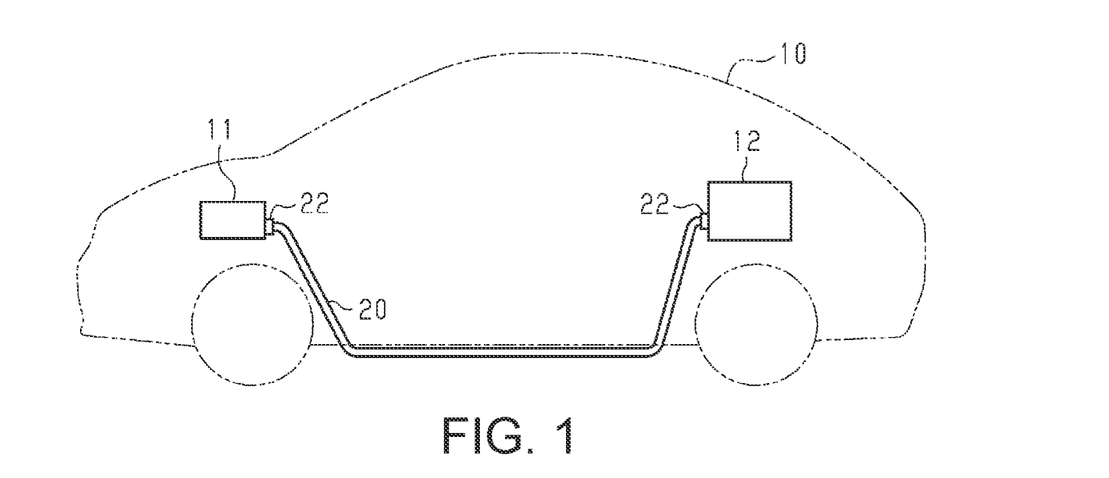
FIG. 1 is a schematic view of a vehicle having a wire harness according to an embodiment.

A vehicle 10 of the present embodiment shown in FIG. 1 is, for example, a hybrid vehicle or an electric automobile, and includes a motor 11 and a power supply source 12 as in-vehicle electric devices. The motor 11 is, for example, a three-phase motor for moving the vehicle 10. The power supply source 12 includes a high-voltage battery and an inverter circuit and supplies a three-phase power to the motor 11 for moving the vehicle 10. The motor 11 and the power supply source 12 are electrically connected to each other by a wire harness 20. Note that the arrangement positions of the motor 11 and the power supply source 12, the mode of routing of the wire harness 20, and the like in FIG. 1 are merely examples.

Figure 2:
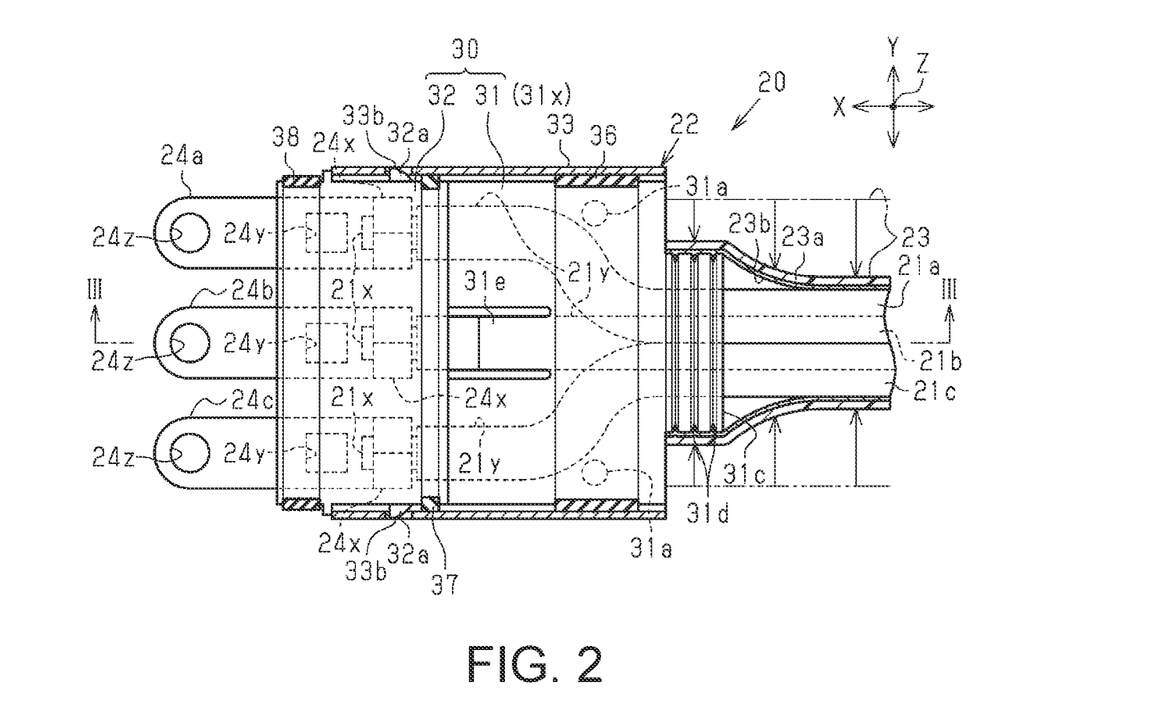
FIG. 2 is a horizontal cross-sectional view of a connector portion and surrounding portions, of the wire harness.
Figure 3:
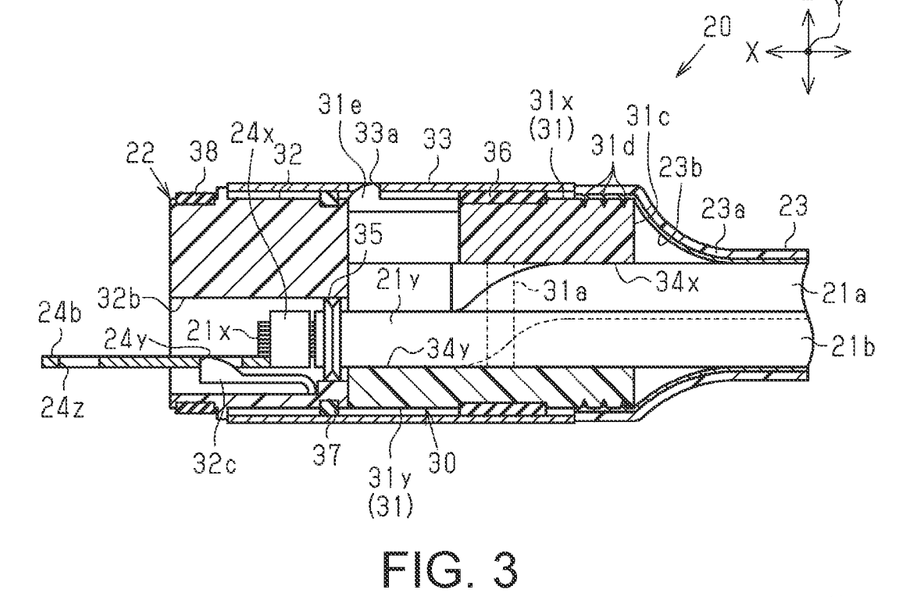
FIG. 3 is a vertical cross-sectional view of the connector portion and the surrounding portions, of the wire harness taken along line III-III in FIG. 2.
Figure 4:
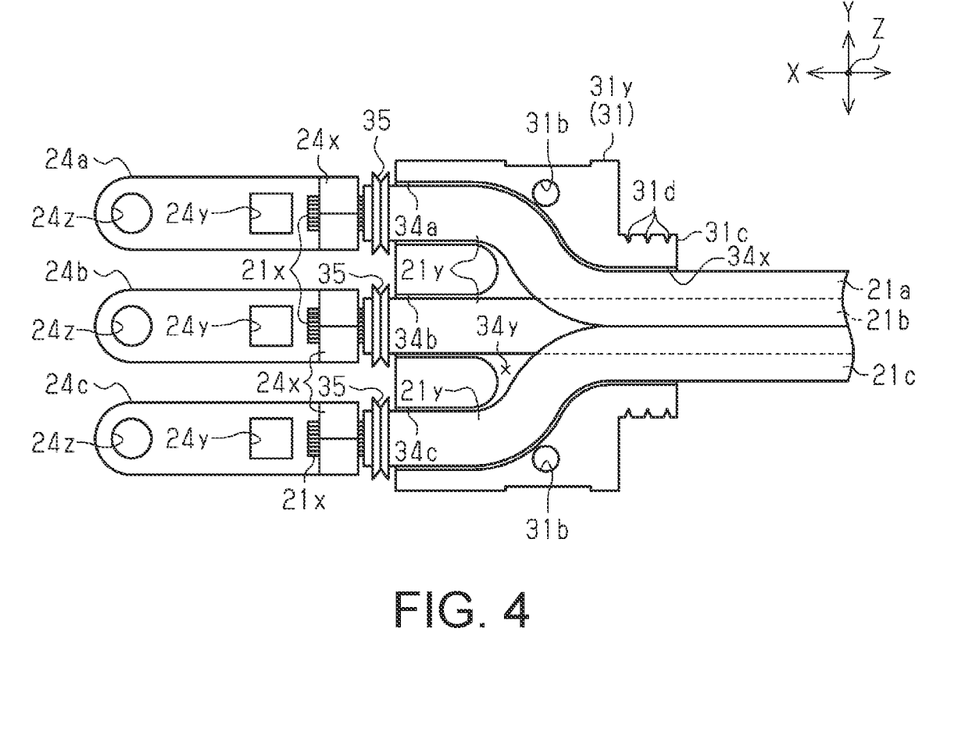
FIG. 4 is a plan view of predetermined components that constitute the connector portion and the surrounding portions, of the wire harness.

As shown in FIGS. 2, 3, and 4, the wire harness 20 includes, for example, three wires 21a, 21b, and 21c for supporting the three-phase power supply, a connector portion 22 (connector) provided at an end portion of the wires 21a to 21c, and a shielding tube 23 (tube) that covers the circumference of the wires 21a to 21c.

The wires 21a to 21c each have a core wire 21x in which a plurality of conductive metal bare wires are bundled, and an insulating coating 21y that covers the circumference of the core wire 21x. The wires 21a to 21c are arranged like a pile of logs, before being introduced into the connector portion 22, and are gradually branched so as to be arranged side by side, in the connector portion 22. At leading end portions of the wires 21a to 21c, the insulation coatings 21y have been stripped, and respective core wire 21x portions are thus exposed. The exposed core wire 21x portions are fixed by crimping to fixing portions 24x at base end portions of connecting terminals 24a, 24b, and 24c arranged in the connector portion 22, and are thereby electrically connected to the fixing portions 24x. One or both ends of the wires 21a to 21c, or in other words, one or both of the motor 11 side and the power supply source 12 side of the wires 21a to 21c are provided with the connector portion 22 (FIG. 1 shows a mode in which both ends are provided with the connector portion 22).

Here, the direction in which the wires 21a to 21c extend is defined as a longitudinal direction (direction X), the direction in which the wires 21a to 21c are arranged side by side is defined as a width direction (direction Y), and the direction that is perpendicular to the longitudinal direction and the width direction is defined as a height direction (direction Z). In the following description, these directions are used.

The connector portion 22 has a wire holder 31 and a terminal housing 32 that constitute a connector main body portion 30 (connector main body) together, and is substantially rectangular parallelepiped-shaped as a whole. A substantially rectangular tube-shaped shielding bracket 33 that covers both the wire holder 31 and the terminal housing 32 is attached to the connector main body portion 30. The wire holder 31 is made of a conductive resin, the terminal housing 32 is made of an insulating resin, and the shielding bracket 33 is made of a conductive metal.

The wire holder 31 has a two-part structure that is divided into upper and lower parts in the height direction, and is formed by combining an upper holder 31x and a lower holder 31y, by, for example, fitting a connecting pin 31a into a connecting hole 31b. An inlet tubular portion 31c protruding in the longitudinal direction and having a substantially cylindrical shape is provided on a base end surface of the wire holder 31. The inlet tubular portion 31c stretches over both the upper holder 31x and the lower holder 31y. Three, for example, annular grooves 31d (first lock) arranged side by side in the longitudinal direction are formed in an outer circumferential surface of the inlet tubular portion 31c. The annular grooves 31d are provided in order to, for example, allow the shielding tube 23 attached to the outer circumferential surface of the inlet tubular portion 31c to bite into the annular grooves 31d.

Inside the inlet tubular portion 31c, an inlet opening 34x is formed through which the three wires 21a to 21c arranged like a pile of logs are introduced. The lower holder 31y of the wire holder 31 has a wire accommodating channel 34y extending continuously from the inlet opening 34x, and the wire accommodating channel 34y accommodates and restricts the paths of the wires 21a to 21c such that the wires 21a to 21c arranged like a pile of logs are gradually branched so as to be arranged side by side (see FIG. 4).

Note that, when the wires 21a to 21c are branched from the inlet opening 34x of the wire holder 31 along the wire accommodating channel 34y, the wire 21b, which is to be positioned in the middle of the three wires arranged side by side, extends in a straight line from the lower side of the pile, while the wires 21a and 21c, which are to be positioned on both sides of the wire 21b, are arranged as the upper two wires in the pile. The upper two wires 21a and 21c in the pile are inclined from the upper side toward the lower side so that the wires 21a and 21c and the wire 21b in the middle lie side by side in the same plane. As a result, the downward inclined portions of the upper two wires 21a and 21c in the pile hold the lower wire 21b in the middle from both sides, and movement of the lower wire 21b in the middle is restricted. In the wire holder 31, the wires 21a are 21c are accommodated extending from the inlet opening 34x along the wire accommodation channel 34y, and are thereby routed with a short untwisted length.

Three openings 34a, 34b, and 34c into which the wire accommodation channel 34y is branched are provided on a leading end side of the wire holder 31, and the leading end portions of the wires 21a to 21c protrude from the respective openings 34a to 34c. In this case, the protruding portions of the wires 21a to 21c that protrude from the openings 34a to 34c include leading end portions of the respective insulating coatings 21y, and seal rings 35 are attached to the protruding portions of the insulating coatings 21y.

The upper holder 31x of the wire holder 31 is provided with a locking piece 31e at a central portion, with respect to the width direction, on the leading end side thereof. The locking piece 31e can be elastically displaced in the vertical direction. The locking piece 31e is locked in a locking hole 33a (second locks) of the shielding bracket 33 (see FIG. 3) when attached covering the wire holder 31, and maintains the state in which the shielding bracket 33 is attached to the wire holder 31. Note that the shielding bracket 33 can be detached from the wire holder 31 if the locked state between the locking piece 31e of the wire holder 31 (upper holder 31x) and the locking hole 33a of the shielding bracket 33 is canceled.

A conductive rubber ring 36 is attached to the base end side of the wire holder 31. The conductive rubber ring 36 is attached to an outer surface of the base end of the wire holder 31 so as to form an annular shape around the longitudinal direction. In this case, the conductive rubber ring 36 is attached covering both the upper holder 31x and the lower holder 31y that are combined to form the wire holder 31, and has the function of preventing the upper holder 31x and the lower holder 31y from separating from each other. Also, the conductive rubber ring 36 is positioned between the wire holder 31 and the shielding bracket 33, and is in surface contact with both the wire holder 31 and the shielding bracket 33 due to its own elasticity. The conductive rubber ring 36 has not only the function of providing a liquid-tight seal between the wire holder 31 and the shielding bracket 33 but also the function of electrically connecting the wire holder 31, which is made of a conductive resin, and the shielding bracket 33, which is made of a conductive metal, to each other.

The shielding bracket 33 is attached to the outside of the wire holder 31 by inserting the wire holder 31 into the shielding bracket 33 in the longitudinal direction. When the shielding bracket 33 is attached to the wire holder 31, the leading end side of the shielding bracket 33 protrudes in a substantially rectangular tube shape. The terminal housing 32 having a substantially rectangular parallelepiped shape is inserted into the protruding portion of the shielding bracket 33. The terminal housing 32 is placed abutting against the leading end portion of the wire holder 31. Locking projections 32a are provided on both side surfaces, with respect to the width direction, of the terminal housing 32 (see FIG. 2). The locking projections 32a are locked in locking holes 33b of the shielding bracket 33 and thus maintain a state in which the terminal housing 32 is attached to the shielding bracket 33.

The terminal housing 32 has three (only one is shown in FIG. 3) insertion holes 32b into which the leading end portions of the wires 21a to 21c are respectively inserted together with the connecting terminals 24a to 24c. Here, since the wires 21a to 21c are positioned and held relative to the wire holder 31, the individual connecting terminals 24a to 24c are maintained while being oriented substantially along the longitudinal direction. Thus, during attachment of the terminal housing 32 to the shielding bracket 33, while the terminal housing 32 is inserted into the leading end portion of the shielding bracket 33 along the longitudinal direction, the three connecting terminals 24a to 24c can be inserted into the respective insertion holes 32b at one time. The seal rings 35 attached to the leading end portions of the insulating coatings 21y of the wires 21a to 21c elastically come into surface contact with inner peripheral surfaces of the respective insertion holes 32b. The seal rings 35 provide a liquid-tight seal between the inner peripheral surfaces of the insertion holes 32b and the respective wires 21a to 21c.

Also, locking pieces 32c are provided on the inner peripheral surfaces of the insertion holes 32b so as to be located under the respective connecting terminals 24a to 24c. The locking pieces 32c can be elastically displaced in the vertical direction. The locking pieces 32c are locked in locking holes 24y in approximately central portions, with respect to the longitudinal direction, of the connecting terminals 24a to 24c and maintain the state in which the terminal housing 32 is attached to the connecting terminals 24a to 24c. Note that the terminal housing 32 and the shielding bracket 33 can be simultaneously detached from the wire holder 31 having the connecting terminals 24a to 24c if the locked state between the locking pieces 32c of the terminal housing 32 (insertion holes 32b) and the locking holes 24y of the connecting terminals 24a to 24c is canceled. Also, the terminal housing 32 can be detached from the shielding bracket 33 if the locked state between the locking projections 32a of the terminal housing 32 and the locking holes 33b of the shielding bracket 33 is canceled.

An O-ring 37 is attached to a section of the base end portion of the terminal housing 32 that is covered by the shielding bracket 33. The O-ring 37 is attached to an outer surface of the base end of the terminal housing 32 so as to form an annular shape around the longitudinal direction. The O-ring 37 is positioned between the terminal housing 32 and the shielding bracket 33, and is in surface contact with both the terminal housing 32 and the shielding bracket 33 due to its own elasticity.

Furthermore, a waterproof rubber ring 38 is attached to a section of the leading end portion of the terminal housing 32 that is exposed from the shielding bracket 33. The waterproof rubber ring 38 is attached to the outer surface of the leading end of the terminal housing 32 so as to form an annular shape around the longitudinal direction. The waterproof rubber ring 38 provides a waterproof structure between the connector portion and a connection target electric device, such as the motor 11 or the power supply source 12. Circular holes 24z are formed in leading end portions of the connecting terminals 24a to 24c that are to be electrically connected to the motor 11 or the power supply source 12. Note that, although the circular holes 24z are given as an example, other hole shapes, such as a horizontally long oval shape, may also be adopted.

As for the wires 21a to 21c that are introduced into the inlet tubular portion 31c of the wire holder 31 of the above-described connector portion 22, sections of the wires 21a to 21c in front of the connector portion 22 in the longitudinal direction are entirely covered by the shielding tube 23. The shielding tube 23 is formed of a heat-shrinkable shielding tube, and specifically is formed by integrating a heat-shrinkable resin layer 23a provided on an outer circumferential side and a conductive layer 23b made of a conductive cloth or the like provided on an inner circumferential side.

As shown with long dashed double-short dashed lines in FIG. 2, the shielding tube 23 before heat treatment is made with an outer diameter that is sufficiently larger (and also an inner diameter that is sufficiently larger, although not shown) than the outer diameter of the pile of wires 21a to 21c, which are arranged like a pile of logs, and the outer diameter of the inlet tubular portion 31c of the wire holder 31. Therefore, the shielding tube 23 before heat treatment allows relatively free movement of the wires 21a to 21c therein and also facilitates insertion of the inlet tubular portion 31c of the wire holder 31 therein. Then, when the shielding tube 23 is treated with hot air, the shielding tube 23 is heat-shrunk, or specifically, the heat-shrinkable resin layer 23a on the outer circumferential side is heat-shrunk, and the diameter of the conductive layer 23b on the inner circumferential side also decreases accordingly.

The heat-shrunk shielding tube 23 has a reduced diameter so as to conform to and come into surface contact with the outer surface of the pile of wires 21a to 21c, which are arranged like a pile of logs, and air inside the shielding tube 23 is also sufficiently expelled to the outside. Note that, even after the shielding tube 23 around the wires 21a to 21c has been heat-shrunk, good flexibility of the wires 21a to 21c is maintained. Furthermore, the shielding tube 23 also comes into surface contact with the outer circumferential portion of the inlet tubular portion 31c of the wire holder 31 and bites into the annular grooves 31d formed in the outer circumferential surface of the inlet tubular portion 31c. Thus, the shielding tube 23 is unlikely to come loose from the inlet tubular portion 31c of the wire holder 31, and a labyrinthine structure is formed between the inlet tubular portion 31c and the shielding tube 23.

In addition, the outer circumferential surface of the inlet tubular portion 31c of the wire holder 31 and the inner circumferential surface of the shielding tube 23, in this case the conductive layer 23b of the shielding tube 23, come into surface contact with each other. Also, since the wire holder 31 itself is made of a conductive resin, and, furthermore, the wire holder 31 is electrically connected to the shielding bracket 33, which is made of a conductive metal, via the conductive rubber ring 36, the shielding bracket 33 and the conductive layer 23b of the shielding tube 23 are also electrically connected to each other. Then, for example, when a ground connection of the shielding bracket 33 is made to a grounded portion (not shown) of the vehicle 10, an electromagnetic shielding structure (electromagnetic shield) in which the circumference of the wires 21a to 21c are surrounded by the shielding bracket 33 and the conductive layer 23b of the shielding tube 23 is formed over the entire length of the wires 21a to 21c in the longitudinal direction.

In this wire harness 20, electromagnetic waves can be generated from the wires 21a to 21c when a high-frequency three-phase AC power is supplied from the power supply source 12 to the motor 11. However, since the electromagnetic shielding structure is adopted over the entire length of the wires 21a to 21c in the longitudinal direction including the connector portion 22, emission of the electromagnetic waves from the wire harness 20 to the outside is sufficiently suppressed.

The effects of the present embodiment will now be described.

(1) As the shielding tube 23 that covers the circumference of the wires 21a to 21c, a heat-shrinkable shielding tube having the conductive layer 23b that is configured to surround the circumference of the wires 21a to 21c is used. Furthermore, when the shielding tube 23 is attached to the inlet tubular portion 31c, which is an attachment portion of the connector main body portion 30 (wire holder 31), the conductive layer 23b of the shielding tube 23, the connector main body portion 30 (wire holder 31), the conductive rubber ring 36, and the shielding bracket 33 are electrically connected to each other. The use of the heat-shrinkable shielding tube, which is easier to electrically connect than a braided shield, makes it possible to easily adopt an electromagnetic shielding structure for the wire harness 20 including the connector portion 22.

(2) The annular grooves 31d are formed in the outer circumferential surface of the inlet tubular portion 31c, which is the attachment portion of the connector main body portion 30 (wire holder 31), and the annular grooves 31d lock the shielding tube 23 in the direction in which it comes loose. Therefore, it is possible to make it unlikely that the shielding tube 23 comes loose from the inlet tubular portion 31c.

(3) Since the annular grooves 31d themselves have an annular shape, the shielding tube 23 is more reliably locked in the direction in which it comes loose, and thus, it is possible to make it even more unlikely that the shielding tube 23 comes loose. Also, since the labyrinthine structure is formed between the shielding tube 23 and the inlet tubular portion 31c, which is the attachment portion for the shielding tube 23, an improvement in sealing performance and other effects can be expected.

(4) Since the conductive rubber ring 36 that is provided between the connector main body portion 30 (wire holder 31) and the shielding bracket 33 is provided in an annular shape, an improvement in the sealing performance between the connector main body portion 30 (wire holder 31) and the shielding bracket 33 and other effects can be expected.

(5) The connector main body portion 30 (wire holder 31) and the shielding bracket 33 are respectively provided with the locking piece 31e and the locking hole 33a that can be locked to and unlocked from each other. The locking piece 31e and the locking hole 33a enable attachment and detachment of the connector main body portion 30 (wire holder 31) and the shielding bracket 33 relative to each other. Thus, for example, the connector main body portion 30 and the shielding bracket 33 can be separately replaced.

(6) As a result of heat shrinkage of the shielding tube 23 accommodating the wires 21a to 21c caused by hot air treatment, the gap inside the shielding tube 23 is reduced, and the cross-sectional diameter of the wire harness 20 can thus be minimized.

(7) Since the heat shrinkage of the shielding tube 23 sufficiently expels unnecessary air inside the shielding tube 23, an air layer with high heat-insulating properties inside the shielding tube 23 is reduced, and heat dissipation of the wires 21a to 21c can thus be improved.

(8) If a well-known braided shielding structure is used, there is concern that metal bare wires constituting the braid may break when a section including the braided portion is fixed by crimping in the connector portion 22 or the like. However, there is no such concern in the present embodiment in which the shielding tube 23 is used.

(9) If a well-known braided shielding structure is used, there is concern that mesh openings of metal bare wires constituting the braid may widen and electromagnetic noise may leak therefrom in the connector portion 22 or the like. However, there is no such concern in the present embodiment in which the shielding tube 23 is used.

The present embodiment can be modified and implemented as follows. The present embodiment and the following modifications can be implemented in a combination with each other insofar as no technical incompatibilities arise.

The connector main body portion 30 is formed by combining a total of three parts: the wire holder 31 made of a conductive resin and the terminal housing 32 made of an insulating resin, where the wire holder 31 is constituted by two parts, the upper holder 31x and the lower holder 31y; however, the parts configuration including the number of parts and the materials may be changed as appropriate.

Figure 5:
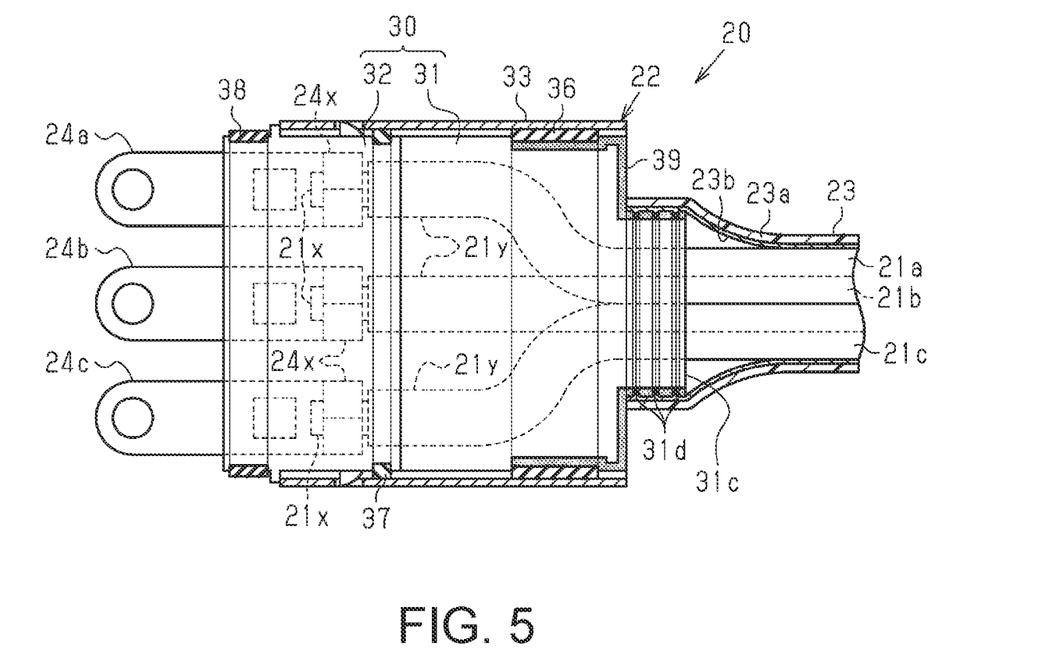
FIG. 5 is a horizontal cross-sectional view of a connector portion and surrounding portions, of a wire harness according to a modification.

For example, instead of producing the entire wire holder 31 from a conductive resin, at least a portion that connects the shielding tube 23 and the conductive rubber ring 36 may be made of a conductive resin, or a conductive portion. In a mode shown in FIG. 5, a conductive plated portion 39 serving as the conductive portion is provided on the outer surface of the wire holder 31 made of an insulating resin, for example, thereby electrically connecting the shielding tube 23 and the conductive rubber ring 36 to each other.

The annular grooves 31d are formed on the inlet tubular portion 31c of the wire holder 31 to prevent the shielding tube 23 from coming loose; however, annular ridges may be formed instead. Also, there is no limitation to the annular shape, and interspersed projections and depressions may be formed instead. Furthermore, the annular grooves 31d or the like need not be formed.

The conductive rubber ring 36 is used as a conductive elastic member that is provided between the wire holder 31 and the shielding bracket 33; however, if the functions of the conductive elastic member are narrowed down to the function of electrically connecting the wire holder 31 and the shielding bracket 33 to each other, the conductive elastic member need not have an annular shape.

The connector main body portion 30 (wire holder 31) and the shielding bracket 33 are respectively provided with the locking piece 31e and the locking hole 33a that can be locked to and unlocked from each other; however, the configuration of these locking portions may be changed as appropriate. Furthermore, these locking portions may be omitted.

In addition to the above, the configuration of the connector portion 22 may be changed as appropriate.

Although the present embodiment is applied to the wire harness 20 including the three wires 21a to 21c, the present disclosure may also be applied to a wire harness in which two or less, or four or more, wires are used.

Although the present embodiment is applied to the wire harness 20 that interconnects the motor 11 and the power supply source 12, which are electric devices installed in the vehicle 10, the electric devices are not limited to these devices. Also, the arrangement positions of the motor 11 and the power supply source 12 in FIG. 1 as well as the mode of routing of the wire harness 20 may be changed as appropriate.

The fixing portions 24x of the connecting terminals of the embodiment may be referred to as wire connection portions. The circular holes 24z of the connecting terminals of the embodiment may be referred to as electrical contacts.

The insertion holes 32b of the terminal housing 32 of the embodiment may be referred to as contact ports for exposing electrical contacts of the connecting terminals to the outside of the connector 22.

The inlet opening 34x of the wire holder 31 of the embodiment may be referred to as a wire insertion port through which the wires are inserted into the connector 22 from the outside of the connector 22. The inlet tubular portion 31c of the wire holder 31 of the embodiment may be referred to as a tubular base end portion.

The upper holder 31x and the lower holder 31y of the wire holder 31 of the embodiment may be referred to as first and second split conductive resin parts.

The conductive rubber ring 36 of the embodiment may be referred to as a conductive elastic tie band.

The wires 21 of the embodiment may have a first length portion that is surrounded by the shielding bracket 33, a second length portion that is surrounded by the inlet tubular portion 31c of the wire holder 31, and a third length portion that is lead out of the connector main body portion 30.

The present disclosure encompasses the following aspects, in which the reference numerals of the constituent elements of the exemplary embodiment are used in order to facilitate the understanding rather than for restriction. Some of items described in the following aspects may be omitted, or some of the items described in the following aspects may be selected or extracted to be combined.

Additional Remark 1: A wire harness (20) according to an aspect of the present disclosure may include:

a wire (21a) having a conductive core wire (21x) and an insulating coating (21y); and a connector (22) attached to a leading end of the wire (21a), wherein the connector (22) may include:

a connecting terminal (24a) having a wire connection portion (24x) connected to the conductive core wire (21x) of the wire (21a) and an electric contact (24z) configured to be connected to a connection target device; and a connector main body portion (30) having a terminal housing (32) that is made of an insulating resin and includes a tubular leading end portion having a contact port (32b) for exposing the electric contact (24z) of the connecting terminal (24a) to the outside of the connector (22), and a wire holder (31) that is made of a conductive resin and includes a tubular base end portion (31c) having a wire insertion port (34x) through which the wire (21a) is inserted into the connector (22) from the outside of the connector (22), the wire connection portion (24x) and a first length portion of the wire (21a) may be placed inside the connector main body portion (30), in an intermediate length portion thereof between the tubular leading end portion of the terminal housing (32) and the tubular base end portion (31c) of the wire holder (31), a second length portion of the wire (21a) that is seamlessly continuous with the first length portion may be placed inside the tubular base end portion (31c) of the wire holder (31), and a third length portion of the wire (21a) that is seamlessly continuous with the second length portion of the wire (21a) may be led out of the connector main body portion (30) from the tubular base end portion (30) of the wire holder (31), and the wire harness (20) may further include:

a tubular conductive shielding member (33) (tubular conductive shield) that covers, from the outside, the wire connection portion (24x), the first length portion of the wire (21a), and the intermediate length portion of the connector main body portion (30); and a heat-shrinkable shielding tube (23) that covers, from the outside, the tubular base end portion (31c) of the wire holder (31) as well as the second length portion and the third length portion of the wire (21a), and is electrically connected to the wire holder (31).

Additional Remark 2: According to an aspect of the present disclosure, the heat-shrinkable shielding tube (23) may include an insulating outermost layer (23a) and a conductive innermost layer (23b), the wire holder (31) may establish electrical continuity between the tubular base end portion (31c) of the wire holder (31) and the conductive innermost layer (23b) of the heat-shrinkable shielding tube (23), and the wire holder (31) may establish electrical continuity between a non-base end portion of the wire holder (31) that is different from the tubular base end portion (31c) and is, for example, thicker than the tubular base end portion (31c) and the tubular conductive shielding member (33).

Additional Remark 3: According to an aspect of the present disclosure, the wire holder (31) can include first and second split conductive resin parts (31x and 31y) that are configured to press against the insulating coating (21y) of the wire and hold the wire when the first and second split conductive resin parts (31x and 31y) are combined, the connector (22) may include a conductive elastic tie band (36) that combine the first and second split conductive resin parts (31x and 31y) by elastically binding the first and second split conductive resin parts (31x and 31y) together, and the tubular conductive shielding member (33) may establish electrical continuity with the wire holder (31) via the conductive elastic tie band (36).

The invention claimed is:

1. A wire harness comprising:

a wire; and a connector provided at an end of the wire, and having an electromagnetic shield for suppressing emission of an electromagnetic wave from the wire, wherein:

the connector includes a connector main body that is partially or entirely made of a conductive resin or is partially formed by a conductive portion, a shield that is made of a conductive metal and covers a periphery of the connector main body, and a conductive elastic member that is provided between the connector main body and the shield, a circumference of the wire is covered by a tube, the tube including a heat-shrinkable shielding tube having a conductive portion that is configured to surround the circumference of the wire, and in a state in which the tube is attached to an attachment of the connector main body, the conductive portion of the tube, the connector main body, the conductive elastic member, and the shield are electrically connected to each other.

2. The wire harness according to claim 1, wherein:

the tube is attached to an outer surface of the attachment of the connector main body, and the attachment has a first lock on the outer surface of the attachment, the first lock being capable of locking the tube at least in a direction in which the tube comes loose.

3. The wire harness according to claim 2, wherein the first lock is provided in an annular shape on the attachment.

4. The wire harness according to claim 1, wherein the conductive elastic member is provided in an annular shape on an outer surface of the connector main body.

5. The wire harness according to claim 1, wherein the connector main body and the shield have second locks that can be locked to and unlocked from each other so as to enable attachment and detachment of the connector main body and the shield relative to each other.

* * * * *